US012785378B2

(12) United States Patent
Yabe

(10) Patent No.: US 12,785,378 B2
(45) Date of Patent: Nov. 3, 2026

(54) CURRENT CUTOFF DEVICE

(71) Applicant: YAZAKI CORPORATION, Tokyo (JP)

(72) Inventor: Hiroo Yabe, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 155 days.

(21) Appl. No.: 18/919,310

(22) Filed: Oct. 17, 2024

(65) Prior Publication Data

US 2025/0158384 A1 May 15, 2025

(30) Foreign Application Priority Data

Nov. 15, 2023 (JP) ................................ 2023-194283

(51) Int. Cl.
*H02H 3/08* (2006.01)
*G01R 15/20* (2006.01)
*G01R 19/00* (2006.01)

(52) U.S. Cl.
CPC ............. *H02H 3/08* (2013.01); *G01R 15/202* (2013.01); *G01R 19/0092* (2013.01)

(58) Field of Classification Search
CPC .............. G01R 15/202; G01R 19/0092; G01R 19/16538; H02H 1/0007; H02H 3/08; H02H 3/087; H02H 7/18; H02H 7/62; H02H 7/663
USPC ........................................................ 361/93.1
See application file for complete search history.

(56) References Cited

FOREIGN PATENT DOCUMENTS

| | | | | | |
|---|---|---|---|---|---|
| JP | 2004-20460 | A | | 1/2004 | |
| JP | 2004020460 | A | * | 1/2004 | |
| JP | 2006217699 | A | * | 8/2006 | |
| JP | 2020100339 | A | * | 7/2020 | .............. H02J 7/663 |
| JP | 2022064560 | A | | 4/2022 | |

OTHER PUBLICATIONS

Machine translation of Fukunaga Japanese Patent Document JP 2004-20460 A Jan. 2004 (Year: 2004).*
Machine translation of Murakami et al. Japanese Patent Document JP 2020-100339 A Jul. 2020 (Year: 2020).*
Machine translation of Yabe Japanese Patent Document JP 2006-214699 A Aug. 2006 (Year: 2006).*

* cited by examiner

*Primary Examiner* — Kevin J Comber
(74) *Attorney, Agent, or Firm* — KENEALY VAIDYA LLP

(57) ABSTRACT

A current cutoff device includes a Hall element that detects a current value of a power supply line that supplies power from a battery to a motor, a cutoff unit that cuts off the power supply line, and a cutoff controller that operates the cutoff unit on a basis of a detection signal of the Hall element to cut off the power supply line. The cutoff controller includes a voltage-current conversion unit that outputs a current according to an output voltage value of the Hall element, a capacitor that is charged according to an output current of the voltage-current conversion unit, and a cutoff signal output unit that outputs a cutoff signal to the cutoff unit in a case where a voltage of the capacitor exceeds a threshold.

4 Claims, 6 Drawing Sheets

CURRENT CUTOFF DEVICE

CROSS-REFERENCE TO RELATED APPLICATION(S)

The present application claims priority to and incorporates by reference the entire contents of Japanese Patent Application No. 2023-194283 filed in Japan on Nov. 15, 2023.

BACKGROUND OF THE INVENTION

1. Field of the Invention

The present invention relates to a current cutoff device.

2. Description of the Related Art

Conventionally, as a current cutoff device, for example, as described in Japanese Patent Application Laid-open No. 2020-100339, a current cutoff system that cuts off a current flowing from a battery to a load is known. This current cutoff system includes a shunt resistor that measures a value of the current flowing from the battery to the load, and cuts a base material between the battery and the load to cut off the current and protect the battery in a case where the value of the current measured by the shunt resistor exceeds a preset threshold.

In the above-described system, there is room for improvement in terms of an increase in battery consumption. That is, in the above-described system, it is necessary to cause a current to constantly flow through the shunt resistor in order to measure the current value, and the consumption of the battery increases.

SUMMARY OF THE INVENTION

Under such circumstances, an object of the present invention is to provide a current cutoff device capable of appropriately cutting off a current by decreasing consumption of a battery.

A current cutoff device according to one aspect of the invention includes a Hall element that detects a current value of a power supply line that supplies power from a battery to a load; a cutoff unit that cuts off the power supply line; and a cutoff controller that operates the cutoff unit on a basis of a detection signal of the Hall element to cut off the power supply line, wherein the cutoff controller includes a voltage-current conversion unit that outputs a current according to an output voltage value of the Hall element, a capacitor that is charged according to an output current of the voltage-current conversion unit, and a cutoff signal output unit that outputs a cutoff signal to the cutoff unit in a case where a voltage of the capacitor exceeds a threshold.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Hereinbelow, embodiments according to the present invention will be described in detail with reference to the drawings. Note that the present invention is not limited by the embodiments. In addition, components in the following embodiments include those that can be easily replaced by those skilled in the art or those that are substantially the same.

EMBODIMENTS

Figure 1:
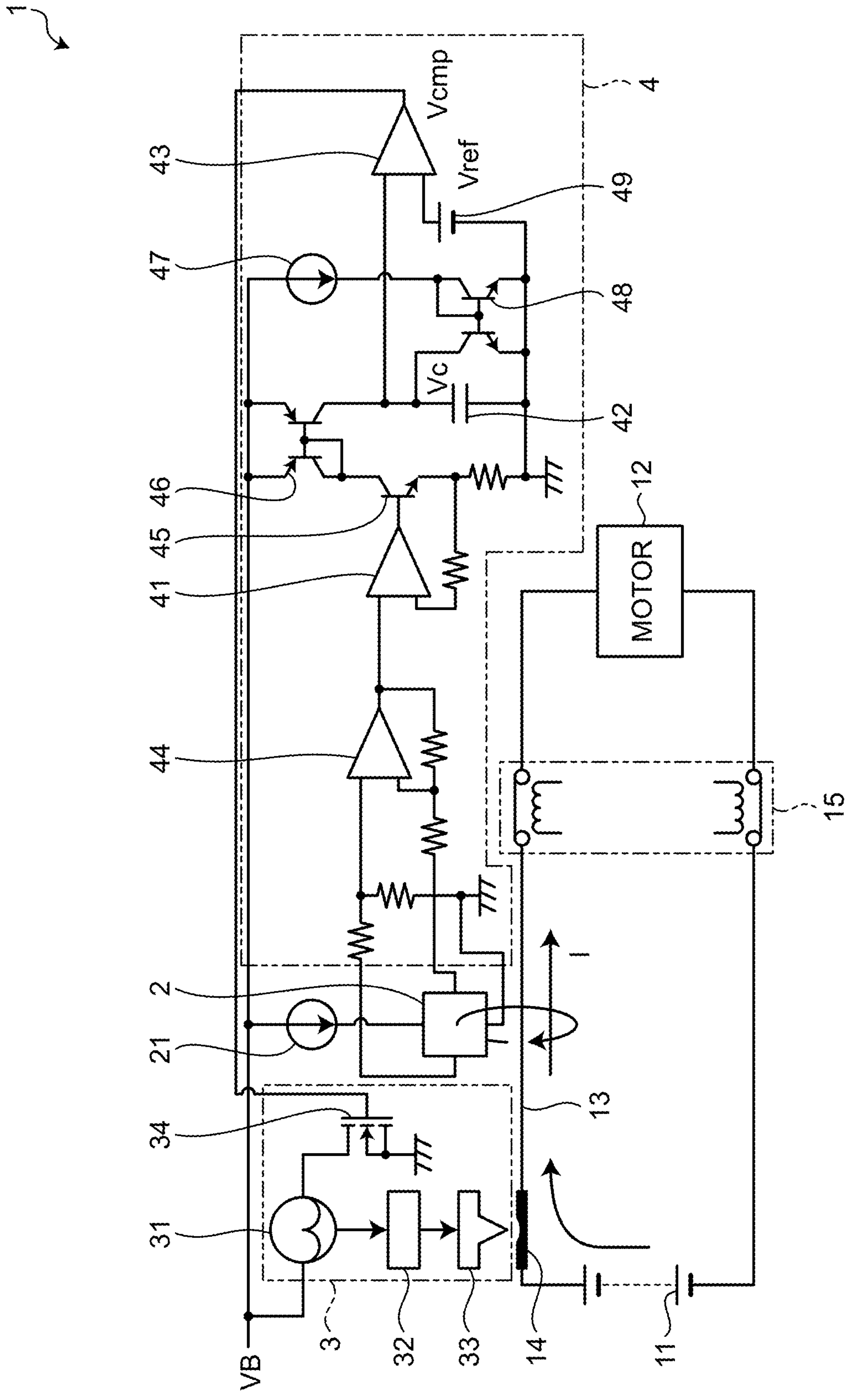
FIG. 1 is a circuit diagram illustrating an outline of a configuration of a current cutoff device according to a first embodiment.

The present embodiment relates to a current cutoff device. As illustrated in FIG. 1, a current cutoff device 1 according to a first embodiment is a device that cuts off a power supply line 13 that supplies power from a battery 11 to a motor 12, and is used by being mounted on an electric vehicle, a hybrid vehicle, or the like using the motor 12 as a driving source. The current cutoff device 1 detects, for example, an overcurrent or a short circuit in the power supply line 13 connected to the battery 11 for a high current, and cuts off the power supply line 13 at the time of the detection.

The battery 11 and the motor 12 are connected by the power supply line 13. As the battery 11, a battery that outputs power capable of driving the motor 12 is used. The motor 12 is a load that operates by receiving power supply from the battery 11. The power supply line 13 is a transmission line for supplying power from the battery 11 to the motor 12, and for example, a coated electric wire in which a conductor is coated with an insulator is used. The power supply line 13 is provided with a cut portion 14 and a relay 15. The cut portion 14 is a component that is cut to cause the current of the power supply line 13 to be cut off, and for example, a bus bar is used as the cut portion 14. The cut portion 14 is cut when the power supply line 13 is short-circuited or an overcurrent of a predetermined current value or more flows through the power supply line 13. The relay 15 is a main relay for turning on and off power to be supplied to the motor 12.

The current cutoff device 1 includes a Hall element 2, a cutoff unit 3, and a cutoff controller 4. The Hall element 2 is a current detector that detects a value of a current flowing through the power supply line 13. For example, the Hall element 2 receives a current from a constant current source 21, detects a magnetic field formed around the power supply line 13, and detects a value of a current flowing through the power supply line 13. Unlike a shunt resistor, the Hall element 2 can be used without the need for receiving a current from the battery 11. Therefore, power consumption of the battery 11 can be decreased.

The cutoff unit 3 is a unit that cuts off the power supply line 13. For example, the cutoff unit 3 operates in response to a cutoff signal from the cutoff controller 4, cuts the cut portion 14, and cuts off the power supply line 13. The cutoff unit 3 includes, for example, an ignition unit 31, a gunpowder storage unit 32, and a cutting unit 33. The ignition unit 31 is a component that receives a cutoff signal and ignites gunpowder stored in the gunpowder storage unit 32. For example, the ignition unit 31 receives a cutoff signal via a switching element or the like, and ignites the gunpowder stored in the gunpowder storage unit 32. The gunpowder storage unit 32 is a storage body that stores gunpowder. The cutting unit 33 is a component that cuts the cut portion 14 to cut off the power supply line 13, and is actuated by explosive force due to ignition of the gunpowder, for example, and abuts on the cut portion 14 to cut the cut portion 14.

The cutoff controller 4 is a cutoff control unit that operates the cutoff unit 3 on the basis of a detection signal of the Hall element 2 to cut off the power supply line 13, and includes, for example, a cutoff control circuit. The cutoff controller 4 includes a voltage-current conversion unit 41, a capacitor 42, and a cutoff signal output unit 43.

The voltage-current conversion unit 41 is a voltage-current conversion circuit that outputs a current corresponding to the output voltage value of the Hall element 2. For example, the voltage-current conversion unit 41 is connected to the output side of the Hall element 2 via an amplifier circuit 44. The amplifier circuit 44 is a circuit that amplifies the detection signal of the Hall element 2. The voltage-current conversion unit 41 receives as input a voltage obtained by amplifying the detection signal of the Hall element 2 by means of the amplifier circuit 44, converts the amplified voltage into a current, and outputs the current. The voltage-current conversion unit 41 is configured using, for example, a differential amplifier, and is configured by connecting a transistor 45 to the output side of the differential amplifier.

The capacitor 42 is a capacitor that is charged according to the output of the Hall element 2. For example, the capacitor 42 is connected to the output side of the voltage-current conversion unit 41 via a first current mirror circuit 46. The first current mirror circuit 46 is a circuit that outputs a current having the same current value as that of the current output from the voltage-current conversion unit 41. For example, a current having the same current value as that of the output current of the voltage-current conversion unit 41 is charged into the capacitor 42 via the first current mirror circuit 46. The capacitor 42 is charged faster as the current output from the voltage-current conversion unit 41 is higher, and the charging voltage is higher as the output current of the voltage-current conversion unit 41 is continuously output for a longer time.

In addition, a constant current is discharged from the capacitor 42 by the constant current circuit 47. For example, the capacitor 42 is connected to the output side of the constant current circuit 47 via a second current mirror circuit 48. Therefore, a current having the same current value as that of the output current of the constant current circuit 47 is discharged from the capacitor 42 via the second current mirror circuit 48. This prevents the voltage value of the capacitor 42 from rising in a case where a higher current than the output current of the constant current circuit 47 is not charged.

A voltage Vc of the capacitor 42 is input into the cutoff signal output unit 43. The cutoff signal output unit 43 is an output circuit that outputs a cutoff signal to the cutoff unit 3 in a case where the voltage Vc of the capacitor 42 exceeds a threshold Vref. For example, a comparator is used as the cutoff signal output unit 43. The threshold Vref is, for example, a voltage set by a constant voltage circuit 49. In a case where the voltage Vc of the capacitor 42 exceeds the threshold Vref, the cutoff signal output unit 43 outputs a cutoff signal to a switching element 34 of the cutoff unit 3 to start the ignition unit 31.

Next, an operation of the current cutoff device 1 according to the first embodiment will be described.

Figure 2:
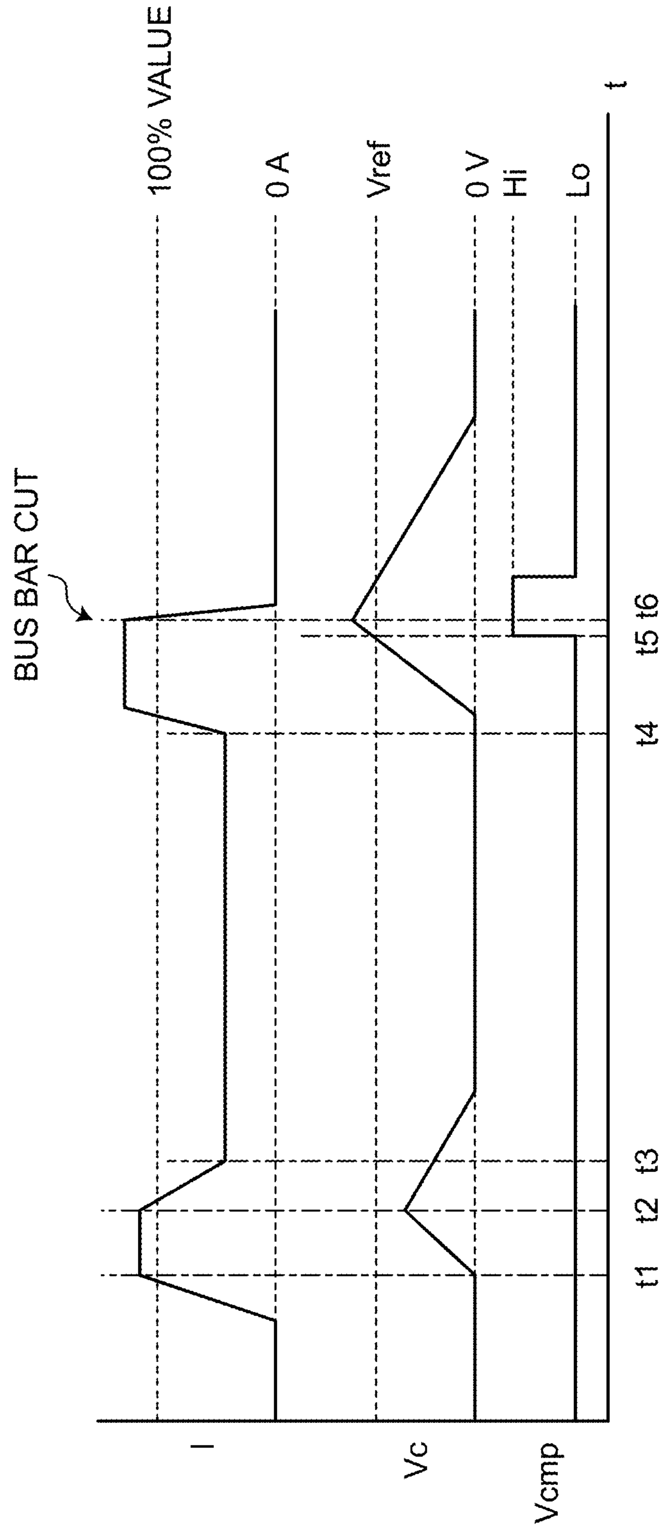
FIG. 2 is a timing chart illustrating an operation of the current cutoff device according to the first embodiment.

FIG. 2 is a timing chart illustrating the operation of the current cutoff device 1, where the horizontal axis represents time, and the vertical axis represents a current I of the power supply line 13, the voltage Vc of the capacitor 42, and an output signal Vcmp of the cutoff signal output unit 43. The 100% value illustrated in FIG. 2 is a current value of the current I at which the capacitor 42 is charged. That is, when the current I of the power supply line 13 exceeds the 100% value, the capacitor 42 starts to be charged.

In FIG. 2, in a case where the current I flowing through the power supply line 13 is an overcurrent exceeding the 100% value, the voltage Vc of the capacitor 42 rises from time t1 to time t2. That is, in FIG. 1, a detection signal is output from the Hall element 2, amplified by the amplifier circuit 44, and converted into a current by the voltage-current conversion unit 41. Then, a current having the same current value as that of the output current of the voltage-current conversion unit 41 is output from the first current mirror circuit 46, and is charged into the capacitor 42. At this time, a current having the same current value as that of the output current of the constant current circuit 47 is discharged from the capacitor 42. Therefore, as the charging current of the capacitor 42 is higher than the discharging current, the voltage Vc of the capacitor 42 starts to rise (time t1).

However, in a case where the current I of the power supply line 13 decreases before the voltage Vc of the capacitor 42 reaches the threshold Vref (time t2), the voltage Vc of the capacitor 42 drops, and the current cutoff of the power supply line 13 is not performed. Therefore, it is possible to reduce erroneous cutoff of the current cutoff device 1. For example, in a case where there is no problem in the battery 11 and the relay 15, such as a case where an instantaneous overcurrent such as a surge current flows through the power supply line 13, the current cutoff device 1 does not cut off the current of the power supply line 13. Thus, the current cutoff device 1 can reduce unnecessary current cutoff.

As illustrated in FIG. 2, when the motor 12 is driven in a steady state from time t3 to time t4, no overcurrent flows through the power supply line 13, the capacitor 42 is not charged, and current cutoff of the power supply line 13 is not performed.

On the other hand, at time t4 in FIG. 2, when the overcurrent starts flowing through the power supply line 13 and continues to flow, the capacitor 42 is charged, and the voltage Vc of the capacitor 42 exceeds the threshold Vref (time t5). As a result, in FIG. 1, the cutoff signal Vcmp is output from the cutoff signal output unit 43 as a high-output signal. Therefore, the ignition unit 31 is activated to ignite the gunpowder, and the cutting unit 33 is operated to cut the cut portion 14. Then, the power supply line 13 is disconnected, the power supply line 13 is cut off, and the battery 11 and the relay 15 are protected from the overcurrent.

The time period from when the overcurrent starts to flow through the power supply line 13 to when the current is cut off can be set according to the capacitance of the capacitor 42. Therefore, the capacitance of the capacitor 42 may be set according to the allowable current of the battery 11 and the relay 15. In addition, the time period from when the overcurrent starts to flow through the power supply line 13 to when the current is cut off can be set according to the current value of the constant current circuit 47. Therefore, the current value of the constant current circuit 47 may be set according to the allowable current of the battery 11 and the relay 15.

As described above, the current cutoff device 1 according to the first embodiment can perform current cutoff while decreasing the consumption of the battery 11 by using the Hall element 2 to detect the current value of the power supply line 13. In addition, the current cutoff device 1 according to the present embodiment charges the capacitor 42 in a case where the current I of the power supply line 13 becomes equal to or higher than a predetermined current value, and cuts off the power supply line 13 in a case where the voltage Vc of the capacitor 42 exceeds the threshold Vref. Therefore, the current cutoff device 1 according to the present embodiment can prevent the power supply line 13 from being cut off by the instantaneous overcurrent. Therefore, the current cutoff device 1 according to the present embodiment can appropriately cut off the current I of the power supply line 13 while decreasing consumption of the battery 11.

In addition, the current cutoff device 1 according to the present embodiment can perform current cutoff while decreasing the consumption of the battery 11 by using the Hall element 2 to detect the current value of the power supply line 13, and thus can extend the cruising distance of the vehicle when being mounted on the vehicle.

In addition, since the current cutoff device 1 according to the present embodiment includes the constant current circuit 47 that discharges a constant current from the capacitor 42, it is possible to reduce instantaneous charging of the capacitor 42 due to the instantaneous overcurrent. Therefore, the current cutoff device 1 according to the present embodiment can appropriately cut off the current I of the power supply line 13 as necessary.

Next, a current cutoff device 1A according to a second embodiment will be described.

Figure 3:
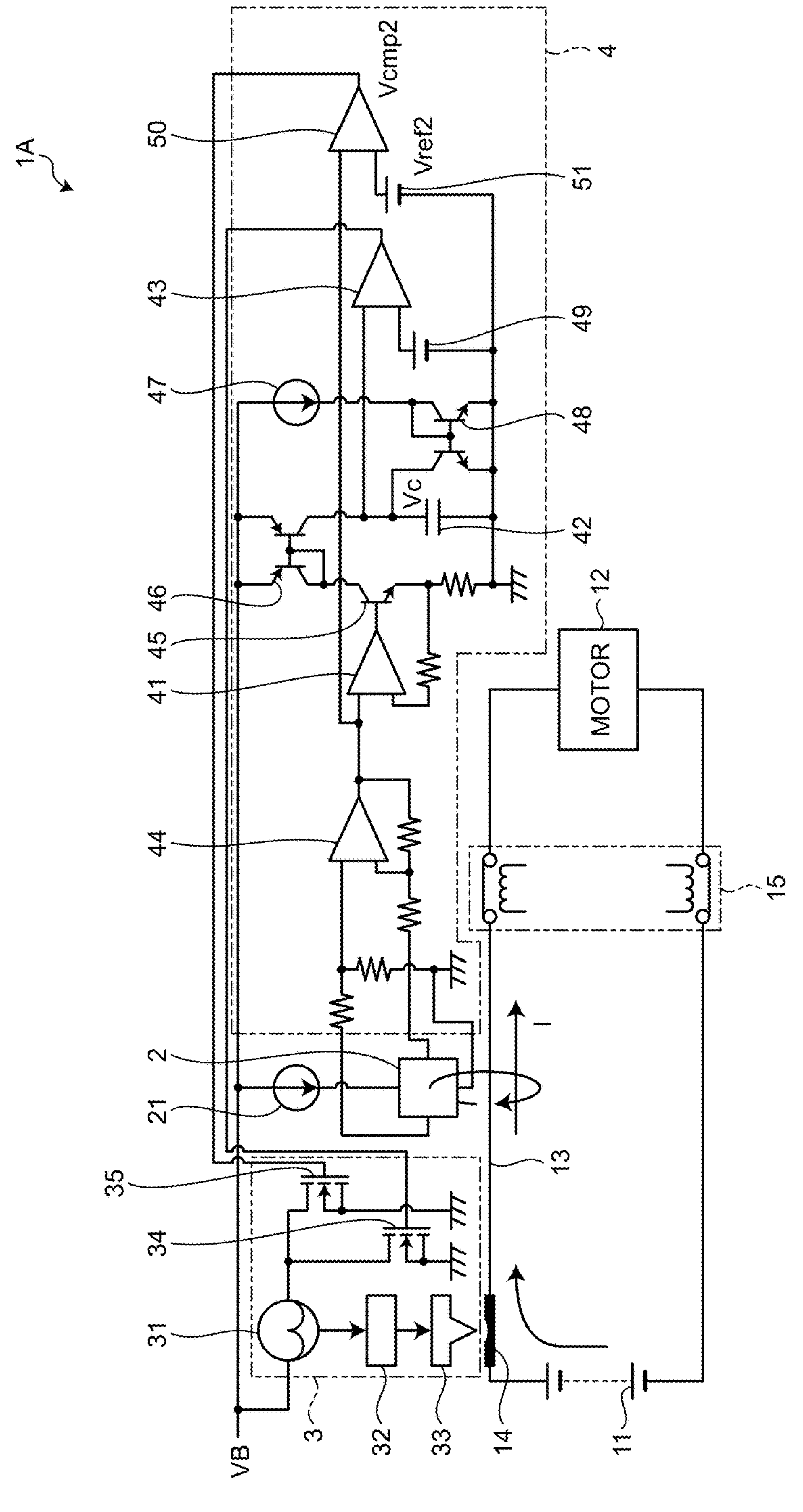
FIG. 3 is a circuit diagram illustrating an outline of a configuration of a current cutoff device according to a second embodiment.

FIG. 3 is a circuit diagram illustrating an outline of a configuration of the current cutoff device 1A according to the second embodiment. The current cutoff device 1A according to the present embodiment is different from the current cutoff device 1 according to the first embodiment in that a second cutoff signal output unit 50 is additionally provided.

Figure 4:
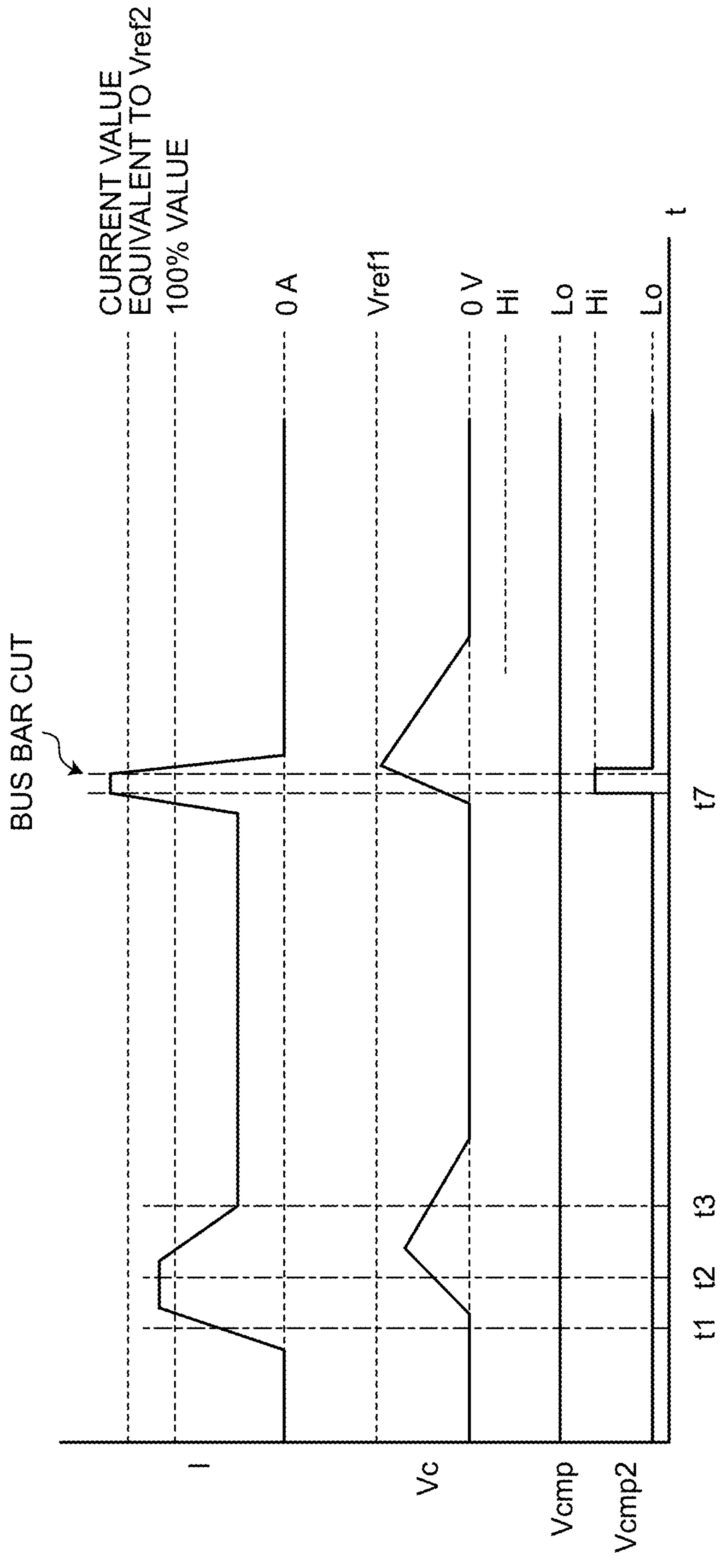
FIG. 4 is a timing chart illustrating an operation of the current cutoff device according to the second embodiment.

The second cutoff signal output unit 50 is a circuit that outputs a cutoff signal Vcmp2 to the cutoff unit 3 without waiting for the voltage Vc of the capacitor 42 to exceed the threshold Vref in a case where a large current flows through the power supply line 13. For example, a comparator is used as the second cutoff signal output unit 50, and the output signal of the amplifier circuit 44 and the output signal of a second constant voltage circuit 51 are input thereto. The second constant voltage circuit 51 sets a threshold Vref2. Therefore, in a case where the detection signal of the Hall element 2 is amplified and exceeds the threshold Vref2, and even in a case where the voltage Vc of the capacitor 42 does not exceed the threshold Vref, the second cutoff signal output unit 50 outputs the cutoff signal Vcmp2 to a switching element 35 of the cutoff unit 3, and the current I of the power supply line 13 is cut off. That is, as illustrated in FIG. 4, when a large current flows through the power supply line 13 and the output of the amplifier circuit 44 exceeds the threshold Vref2 (time t7), the current I of the power supply line 13 is instantaneously cut off.

In this manner, the current cutoff device 1A according to the present embodiment can promptly cut off the current in a case where a large current that disturbs the battery 11 and the relay 15 flows through the power supply line 13 while preventing the power supply line 13 from being cut off by the instantaneous overcurrent. Therefore, the current cutoff device 1A according to the present embodiment can appropriately cut off the current I of the power supply line 13 to further improve safety.

Next, a current cutoff device 1B according to a third embodiment will be described.

Figure 5:
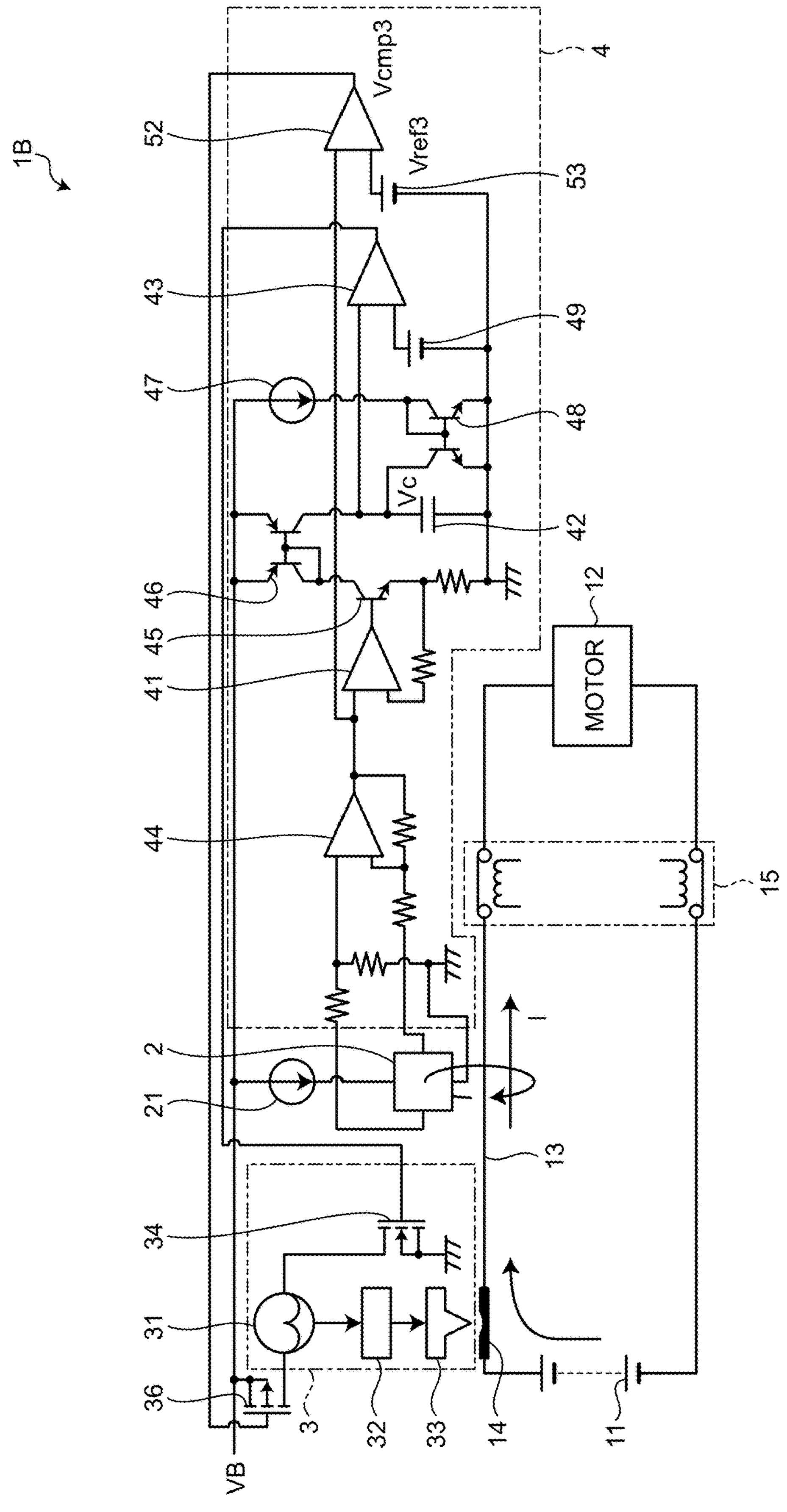
FIG. 5 is a circuit diagram illustrating an outline of a configuration of a current cutoff device according to a third embodiment.

FIG. 5 is a circuit diagram illustrating an outline of a configuration of the current cutoff device 1B according to the third embodiment. The current cutoff device 1B according to the present embodiment is different from the current cutoff device 1 according to the first embodiment in that a third cutoff signal output unit 52 is additionally provided.

The third cutoff signal output unit 52 is a circuit that outputs a cutoff signal Vcmp3 to the cutoff unit 3 in a case where a large current flows through the power supply line 13. For example, a comparator is used as the third cutoff signal output unit 52, and the output signal of the amplifier circuit 44 and the output signal of a third constant voltage circuit 53 are input thereto. The third constant voltage circuit 53 sets a threshold Vref3. The threshold Vref3 is set to a current value at which the current I of the power supply line 13 is equal to the 100% value or lower than the 100% value.

Figure 6:
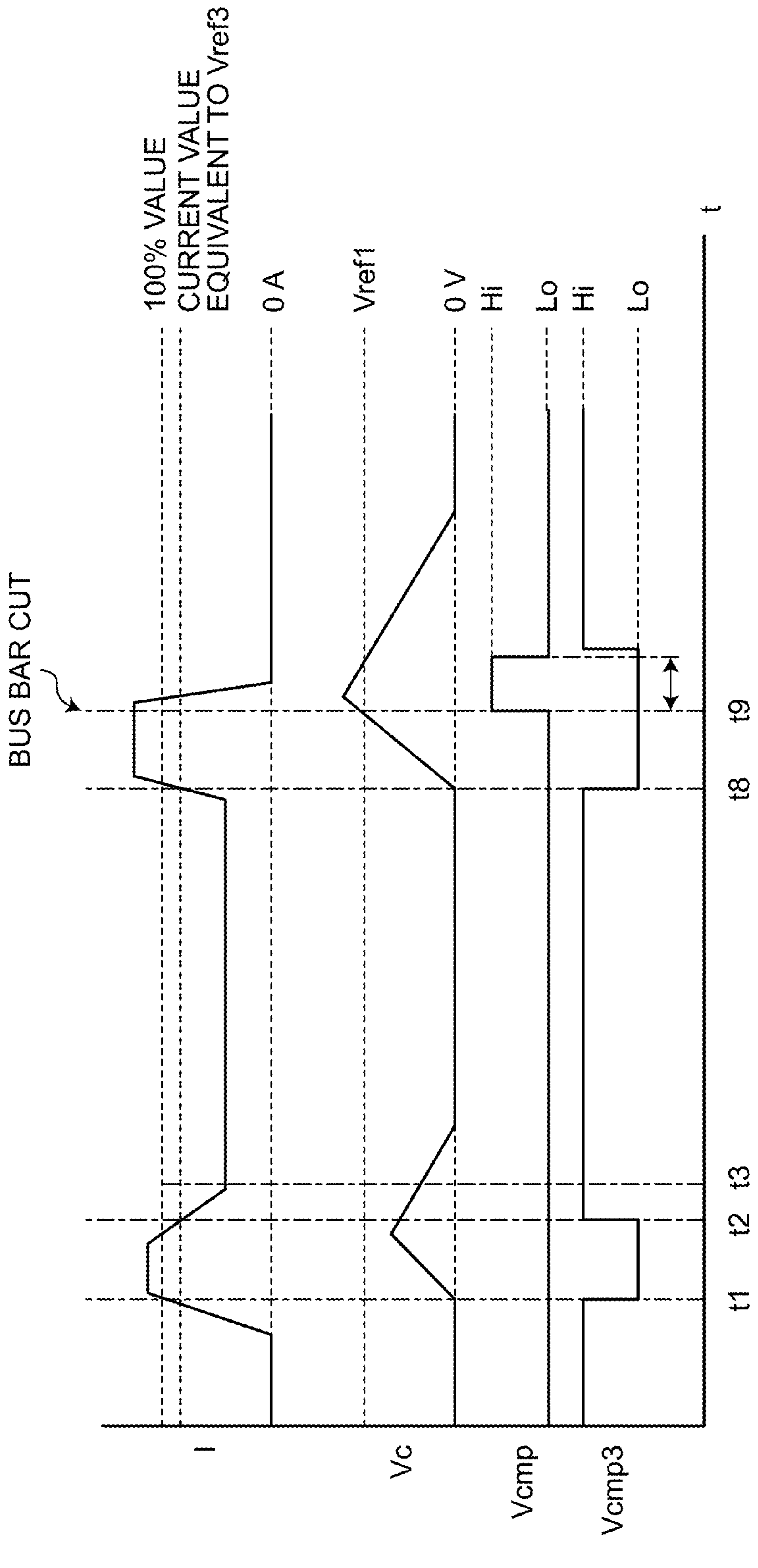
FIG. 6 is a timing chart illustrating an operation of the current cutoff device according to the third embodiment.

In a case where the detection signal of the Hall element 2 is amplified and exceeds the threshold Vref3, the third cutoff signal output unit 52 outputs the cutoff signal Vcmp3 as a low-output signal to a switching element 36 of the cutoff unit 3. The switching element 36 is provided between the ignition unit 31 and a power supply VB, and the ignition unit 31 is ready for activation by outputting the cutoff signal Vcmp3 as a low signal. Then, in a state in which the ignition unit 31 is ready for activation, in a case where the voltage Vc of the capacitor 42 exceeds the threshold Vref due to the overcurrent of the power supply line 13, the ignition unit 31 is activated, and the current I of the power supply line 13 is cut off. That is, as illustrated in FIG. 6, at time t9, when the cutoff signal Vcmp3 is output as a low signal and the voltage Vc of the capacitor 42 exceeds the threshold Vref, the current I of the power supply line 13 is instantaneously cut off.

As described above, in the current cutoff device 1B according to the present embodiment, in a case where the cutoff signal Vcmp3 is output as a low signal and the voltage Vc of the capacitor 42 exceeds the threshold Vref, the current I of the power supply line 13 is instantaneously cut off, so that it is possible to prevent the current I from being erroneously cut off when the voltage Vc of the capacitor 42 unintentionally exceeds the threshold Vref due to noise or the like in a case where the current I of the power supply line 13 is not an overcurrent.

Note that the current cutoff device according to the present invention is not limited to the above-described embodiments, and various modifications can be made within the scope described in the claims. The current cutoff device according to each embodiment may be configured by appropriately combining the components of the above-described embodiments and modifications.

For example, in the second embodiment and the third embodiment, the second cutoff signal output unit 50 and the third cutoff signal output unit 52 use the cutoff signal output unit 43, the Hall element 2, and the amplifier circuit 44 in common, but Hall elements and amplifier circuits for the second cutoff signal output unit 50 and the third cutoff signal output unit 52 may be provided separately from the Hall element 2 and the amplifier circuit 44.

Also, in each of the embodiments described above, the cutoff controller 4 in FIGS. 1, 3, and 5 may be an integrated circuit implemented on the same silicon substrate, and the Hall element 2 may be provided on the silicon substrate. In addition, the Hall element 2 may be provided with a component such as a magnetic core in order to guide a magnetic field of the current I and to keep away an external magnetic field that becomes an error factor.

In each of the above-described embodiments, the current cutoff device mounted on the vehicle has been described. However, the current cutoff device according to the present invention may be applied to a device not mounted on the vehicle.

According to a current cutoff device of the present embodiment, it is possible to decrease consumption of a battery and appropriately cut off a current.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A current cutoff device comprising:

a Hall element that detects a current value of a power supply line that supplies power from a battery to a load;

a cutoff unit that cuts off the power supply line; and a cutoff controller that operates the cutoff unit on a basis of a detection signal of the Hall element to cut off the power supply line, wherein the cutoff controller includes:

a voltage-current conversion unit that outputs a current according to an output voltage value of the Hall element, a capacitor that is charged according to an output current of the voltage-current conversion unit, a first cutoff signal output unit that is configured to output a first cutoff signal to the cutoff unit in a case where a voltage of the capacitor exceeds a first threshold, and a second cutoff signal output unit that is configured to output a second cutoff signal to the cutoff unit, and the cutoff unit cuts off the power supply line if the cutoff unit receives at least one of the first cutoff signal and the second cutoff signal.

2. The current cutoff device according to claim 1, wherein the cutoff controller further includes a constant current circuit that discharges a constant current from the capacitor.

3. The current cutoff device according to claim 1, wherein the capacitor starts charging at a predetermined start current, the second cutoff signal output unit is configured to output the second cutoff signal in a case where an amplified output voltage of the Hall element exceeds a second threshold, the second threshold is a reference voltage that corresponds to a current that is greater than the predetermined start current, and the cutoff unit is configured to cut off the power supply line if the cutoff unit receives the first cutoff signal or the second cutoff signal.

4. The current cutoff device according to claim 1, wherein the capacitor starts charging at a predetermined start current, the second cutoff signal output unit is configured to output the second signal in a case where an amplified output voltage of the Hall element exceeds a second threshold, the second threshold is a reference voltage that corresponds to a current that is less than or equal to the predetermined start current, and the cutoff unit is configured to cut off the power supply line if the cutoff unit receives the first cutoff signal and the second cutoff signal during a same time interval.

* * * * *